US008189713B2

(12) United States Patent  
Shinsuke et al.

(10) Patent No.: US 8,189,713 B2
(45) Date of Patent: May 29, 2012

(54) MATRIX POWER AMPLIFIERS FOR HIGH SPEED WIRELESS APPLICATIONS

(75) Inventors: Inui Shinsuke, Yokohama (JP); Ikuroh Ichitsubo, Sagamihara (JP); Shigeru Watanabe, Tokyo (JP)

(73) Assignee: Micro Mobio Corporation, Palo Alto, CA (US)

( * ) Notice: Subject to any disclaimer, the term of this patent is extended or adjusted under 35 U.S.C. 154(b) by 355 days.

(21) Appl. No.: 12/689,038

(22) Filed: Jan. 18, 2010

(65) Prior Publication Data

US 2011/0176623 A1 Jul. 21, 2011

(51) Int. Cl.
*H04K 1/02* (2006.01)
(52) U.S. Cl. ........ 375/297; 375/219; 375/260; 375/267; 375/295; 375/299; 455/39; 455/91; 455/101; 455/114.3; 455/127.1; 455/127.2; 455/127.3; 455/500; 455/522; 330/98; 330/124 R; 330/125; 330/126; 330/148
(58) Field of Classification Search .................. 375/219, 375/260, 267, 295, 297, 299; 455/39, 91, 455/101, 114.3, 127.1, 127.2, 127.3, 500, 455/522; 330/98, 124 R, 125, 126, 147, 330/148
See application file for complete search history.

(56) References Cited

U.S. PATENT DOCUMENTS

| | | | |
|---|---|---|---|
| 4,977,041 A | 12/1990 | Shiozawa | |
| 5,656,972 A | 8/1997 | Norimatsu | |
| 5,880,635 A | 3/1999 | Satoh | |
| 6,025,651 A | 2/2000 | Nam | |
| 6,151,509 A | 11/2000 | Chorey | |
| 6,262,630 B1 | 7/2001 | Eriksson | |
| 6,381,212 B1 * | 4/2002 | Larkin | 370/210 |
| 6,417,730 B1 * | 7/2002 | Segallis et al. | 330/129 |
| 6,462,622 B1 | 10/2002 | Mori | |
| 6,625,050 B2 | 9/2003 | Suwa | |
| 6,678,506 B1 | 1/2004 | Dolman | |
| 6,791,407 B2 * | 9/2004 | Grebennikov et al. | 330/133 |
| 6,798,287 B2 | 9/2004 | Wu | |
| 6,847,262 B2 * | 1/2005 | Ichitsubo et al. | 330/307 |
| 7,157,966 B2 * | 1/2007 | Baree et al. | 330/133 |
| 7,444,124 B1 * | 10/2008 | Loeb et al. | 455/127.3 |
| 7,675,360 B2 * | 3/2010 | Arai et al. | 330/129 |
| 8,102,212 B2 * | 1/2012 | Dally et al. | 330/279 |
| 2004/0127185 A1 | 7/2004 | Abrahams | |
| 2004/0203552 A1 | 10/2004 | Horiuchi | |
| 2004/0207467 A1 * | 10/2004 | Ichitsubo et al. | 330/129 |
| 2005/0239415 A1 | 10/2005 | Sagae | |
| 2008/0218270 A1 * | 9/2008 | Hau et al. | 330/289 |
| 2009/0179698 A1 * | 7/2009 | Ichitsubo et al. | 330/133 |
| 2010/0277237 A1 * | 11/2010 | Sinha et al. | 330/197 |

* cited by examiner

*Primary Examiner* — Leon Flores
(74) *Attorney, Agent, or Firm* — SV Patent Service (57) ABSTRACT

A wireless communication device includes an RF transceiver configured to up convert a base band signal to a transmitting RF signal, a configurable matrix power amplifier circuit configured to amplify the transmitting RF signal to produce an amplified RF signal, and an antenna configured to transmit a wireless signal in response to the amplified RF signal.

23 Claims, 10 Drawing Sheets

MATRIX POWER AMPLIFIERS FOR HIGH SPEED WIRELESS APPLICATIONS

BACKGROUND

The present invention relates to radio frequency (RF) power amplifiers.

Wireless communication devices such as laptop personal computers, personal digital assistants, mobile internet and email devices, cellular phones, smart phones, and wireless household appliances are being developed in ever increasing functions supported by expanded circuit features. Correspondingly, electrical components thereof must decrease in size while still providing radio transmission performance. A major component of a wireless communication device is the power amplifiers. A power amplifier can be fabricated in an integrated circuit to provide signal amplification with substantial power. For high order modulated signals used in high speed wireless data, a significant challenge to the RF power amplifiers is to provide high linearity power amplification while minimizing power consumption to extend the time between consecutive battery charges in the mobile wireless devices. Another requirement for mobile wireless devices is to reduce heat dissipation to allow the proper operation of the electronic circuits in the wireless devices.

A recent development in high speed wireless communication technologies is the use of multiple-input multiple-output communications (MIMO), which is adopted as a key component in the high speed wireless standards such WiMax, LTE, LTE-Advanced, or other 4G wireless standards. MIMO refers to the technology where there are multiple antennas at the base station and multiple antennas at the mobile wireless device. Examples of a multiple antenna technology includes cellular phones with two antennas, laptops with two antennas (e.g. built in the left and right side of the screen), as well as customer-premises equipment (CPE) wireless devices with multiple sprouting antennas. MIMO can enable space-time code or spatial multiplexing in which two or more antennas can be employed at the transmitter. When two or more antennas are used in RF signal transmitting, two or more power amplifiers are generally needed.

There is therefore a need for more energy efficient RF power amplifiers to enable newly developed high speed wireless communication technologies.

SUMMARY

The present application discloses configurable matrix RF power amplifiers that provide efficient and flexible amplification for RF applications. The matrix RF power amplifiers can be dynamically configured to provide linear power amplification in a wide dynamic range of RF output power, while minimizing power consumption and heat generation. The disclosed matrix RF power amplifiers can provide customized RF amplification according to the mode of power amplification such as link budget, the distance to the base station, the signal-to-noise ratio, and the wireless standard). The disclosed matrix RF amplifier circuits are suitable for various wireless modulation schemes and wireless communications standards.

In a general aspect, the present invention relates to a wireless communication device that includes an RF transceiver configured to up convert one or more base band signals to one or more transmitting RF signals and an RF amplifier circuit that can amplify the one or more transmitting RF signals to produce one or more amplified RF signals. The RF amplifier circuit can include a matrix of configurable RF amplifier elements $A_{ij}$ connected in M rows, wherein $i=1, 2 \ldots M$ and $j=1, 2 \ldots N$, wherein M and N are integers equal to or larger than two, wherein the output of the RF amplifier element $A_{ij}$ is connected to the input of the RF amplifier element $A_{i(j+1)}$, wherein the RF amplifier element $A_{ij}$ is configured to be controlled to at least three states, wherein the RF amplifier element $A_{ij}$ is configured to amplify an RF signal by a gain $g_{ij} > 1$ in a first state, wherein $g_{ij}$ is the ratio of the output RF power over the input RF power for the RF amplifier element $A_{ij}$, wherein the RF amplifier element $A_{ij}$ is configured to pass the RF signal without amplification to the input of the RF amplifier element $A_{i(j+1)}$ in a second state, wherein the RF amplifier element $A_{ij}$ is configured to substantially block the RF signal from reaching the input or the output of the RF amplifier element $A_{i(j+1)}$ in a third state; a plurality of input nodes each in communication with the RF transceiver and connected to the input of one of the RF amplifier elements $A_{ij}$; and a plurality of output nodes each configured to output the amplified RF signal from one of the RF amplifier elements $A_{iN}$. The wireless communication device can also include one or more antennas each configured to transmit a wireless signal in response to the amplified RF signal from one or more of the plurality of the output nodes.

In another general aspect, the present invention relates to a wireless communication device that includes an RF transceiver configured to up convert one or more base band signals to one or more transmitting RF signals and an RF amplifier circuit that can amplify the one or more transmitting RF signals to produce one or more amplified RF signals. The RF amplifier circuit can a matrix of configurable RF amplifier elements $A_{ij}$ connected in M rows, wherein $i=1, 2 \ldots M$ and $j=1, 2 \ldots N$, wherein M and N are integers equal to or larger than two, wherein the output of the RF amplifier element $A_{ij}$ is connected to the input of the RF amplifier element $A_{i(j+1)}$, wherein the RF amplifier element $A_{ij}$ is configured to be controlled to two or more states, wherein the RF amplifier element $A_{ij}$ is configured to amplify an RF signal by a gain $g_{ij} > 1$ in a first state, wherein $g_{ij}$ is the ratio of the output RF power over the input RF power for the RF amplifier element $A_{ij}$, wherein the RF amplifier element $A_{ij}$ is configured to pass the RF signal without amplification to the input of the RF amplifier element $A_{i(j+1)}$ in a second state; a plurality of input nodes each in communication with the RF transceiver and connected to the input of one of the RF amplifier elements $A_{i1}$; and a plurality of output nodes each configured to output the amplified RF signal from one of the RF amplifier elements $A_{iN}$. The wireless communication device can also include one or more antennas each configured to transmit a wireless signal in response to the amplified RF signal from one or more of the plurality of the output nodes.

In yet another general aspect, the present invention relates to a wireless communication device that includes an RF transceiver configured to up convert one or more base band signals to one or more transmitting RF signals and a multiple-inputs-multiple-outputs (MIMO) RF amplifier circuit that can amplify the one or more transmitting RF signals in to produce one or more amplified RF signals. The RF amplifier circuit can include a plurality of configurable RF amplifier elements $A_{ij}$ disposed in a plurality of parallel rows, wherein at least one of the plurality of rows comprises a first RF amplifier element and a second RF amplifier element that are connected in a parallel circuit and a third RF amplifier element that is cascade connected to the parallel circuit of the first RF amplifier element and the second RF amplifier element together, wherein each of the RF amplifier elements is configured to be controlled to at least three states, wherein each of the RF amplifier elements is configured to amplify an RF signal by a gain $g_{ij}$>1 in a first state, to pass the RF signal without amplification in a second state, and to substantially block the RF signal in a third state, wherein $g_{ij}$ is the ratio of the output RF power over the input RF power for the RF amplifier element $A_{ij}$; a plurality of input nodes each in communication with the RF transceiver and connected to the input of one of the RF amplifier elements $A_{i1}$; and a plurality of output nodes each configured to output the amplified RF signal from one of the RF amplifier elements $A_{iN}$. The wireless communication device can also include one or more antennas each configured to transmit a wireless signal in response to the amplified RF signal from one or more of the plurality of the output nodes.

Implementations of the system may include one or more of the following. The wireless communication device can further include a matrix power amplifier selector that can control the RF amplifier element $A_{ij}$ to be in one of the three states. The wireless communication device can further include a sensing circuit that can sense at least one of a power, a gain, or a phase of the amplified RF signal and to produce a sensing signal, wherein the matrix power amplifier selector can control the RF amplifier element $A_{ij}$ in response to the sensing signal. The wireless communication device can further include a linearity feedback controller that can control gain or phase variation in a power amplification range of the amplified RF signal in response to the sensing signal. The matrix power amplifier selector can vary the combined amplification of a row of RF amplifier elements $A_{ij}$ in the matrix by controlling at least one of the RF amplifier elements $A_{ij}$ in the row to the second state. The matrix power amplifier selector can deactivate at least one row of RF amplifier elements $A_{ij}$ in the matrix by controlling at least one of the RF amplifier elements $A_{ij}$ in the row to the third state. M can be equal to 2. N can be equal to 3. The plurality of input nodes can be connected to receive a common transmitting RF signal from the RF transceiver. Two or more of the plurality of output nodes can be connected to output a common amplified RF signal. The RF transceiver and the RF amplifier circuit can be compatible with wireless modulation schemes Orthogonal Frequency-Division Multiplexing (OFDM) or Orthogonal Frequency-Division Multiplexing Access (OFDMA). The RF transceiver and the RF amplifier circuit can be compatible with wireless communications standards 3GPP, LTE, LTE-Advanced, IMT-2000, WiMax (802.16), WiBro, and WiFi (802.11).

BRIEF DESCRIPTION OF THE DRAWINGS

The following drawings, which are incorporated in and from a part of the specification, illustrate embodiments of the present specification and, together with the description, serve to explain the principles of the specification.

DETAILED DESCRIPTION

Figure 1:
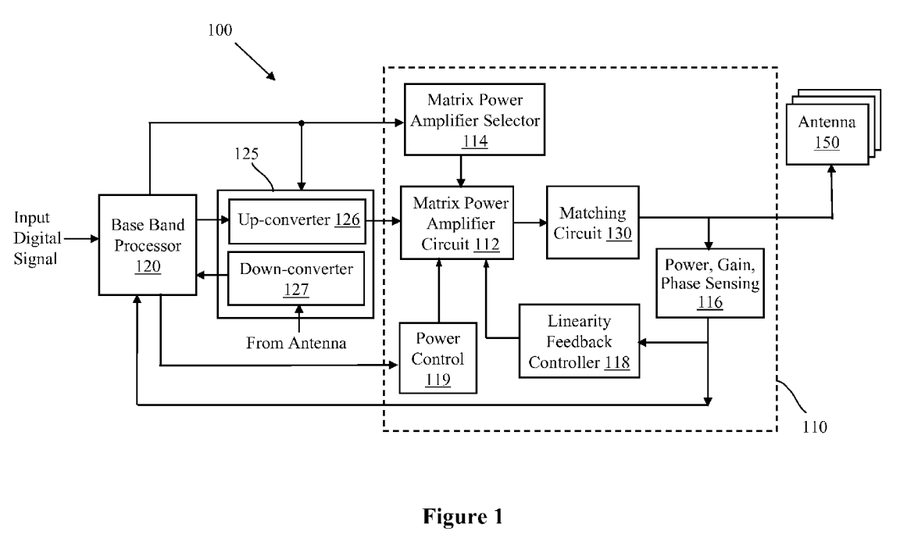
FIG. 1 is a schematic diagram for a wireless communication device in accordance with the present specification.

Referring to FIG. 1, a wireless communication device 100 includes a base band processor 120, an RF transceiver 125 comprising an up-converter 126 and a down-converter 127, a power amplifier module 110, and one or more antennas 150. The wireless communication device 100 can for example be a PDA, a WLAN adaptor, a cellular phone, or other mobile transmitting device. The power amplifier module 110 can be fabricated on a single semiconductor chip. The power amplifier module 110 can include a matrix power amplifier circuit 112, a matrix power amplifier selector 114, a matching circuit 130, a sensing circuit 116, a linearity feedback controller 118, and a power control circuit 119. The multiple antennas 150, as described in more detail below, can support multiple output (MO) WiMax applications.

In the transmission path, the base band processor 120 can generate one or more base-band signals in response to an input digital signal. The one or more base-band signals are up-converted by the up-converter 126 in the RF transceiver 125 to produce one or more transmission RF signals having a higher frequency than the base band signal. The transmission RF signals reside in radio frequency bands as specified by wireless standards. The one or more transmitting RF signals are amplified by the matrix power amplifier circuit 112 to output amplified RF signals for transmission by the antenna(s) 150. As described below in conjunction with FIGS. 2A, 2B, 3A-7B, different transmission RF signals can be amplified by different rows of amplifier elements in the matrix power amplifier circuit. The matching circuit 130 provides impedance matching to the amplified RF signals to the antenna(s) 150. The matrix power amplifier circuit 112 can be turned ON/OFF by the power control signal produced by the power control circuit 119. The matrix power amplifier circuit 112 can be controlled by the base band processor 120 via a matrix power amplifier selector 114. As described in detail below, the matrix power amplifier selector 114 is configured to control the matrix power amplifier circuit 112 under the control of the base band processor 120. The disclosed power amplifier module 110 is suitable for different wireless modulation schemes such as Orthogonal Frequency-Division Multiplexing (OFDM) and Orthogonal Frequency-Division Multiplexing Access (OFDMA), and various wireless communications standards such as 3GPP, LTE, LTE-Advanced, IMT-2000, WiMax (802.16), WiBro, or WiFi (802.11), and others.

In the reception path (not shown in detail in FIG. 1), the down-converter 127 receives an amplified reception RF signal from the antenna, and convert the reception RF signal to a base band signal, which is to be received and processed by the base band process 120.

To provide excellent output linearity, a power amplifier must maintain a constant gain and phase over a wide output range. However, the power amplifier can be driven close to saturation at high output power level, which makes it difficult to maintain a constant gain. The quality of digital communication, especially the quality degrades at high output power level, can commonly be measured by Error Vector Magnitude (EVM), Bit Error Rate (BER), Packet Error Rate (PER), and Adjacent Channel Power Ratio (ACPR).

The sensing circuit 116 can detect the power, the gain, and the phase of the output signal from the matrix power amplifier circuit 112. The linearity feedback controller 118 is configured to provide control signals to a gain control circuit and a phase control circuit for reducing gain variation and phase variations over a power amplification range, which allows the power amplifier module 110 to amplify input RF signals by close-loop control. The output linearity can be improved by a feedback control based on the sensing of the output power level. The sensing circuit 116 can measure the power of the output RF signal and send a sensing signal to the base band processor 120. The base band processor 120 can set the transmission power level by varying the input signal to the RF transceiver 125 and in turn to the power amplifier module 110 in accordance to the sensing signal produced by the sensing circuit 116. The linearity feedback controller 118 is configured to process the power-sensing signal from the sensing circuit 116 and compute a quality or a magnitude of the output signal. A power-sensing control signal is then generated by the linearity feedback controller 118 to control the matrix power amplifier circuit 112 in response to the quality, or the magnitude, or a combination thereof, of the output signal. The linearity feedback controller 118 can improve output linearity of the Matrix power amplifier circuit 112 by adjusting the bias of the biasing circuits in accordance to the actual output power measured by the sensing circuit 116. It can reduce gain saturation and maintain a more constant gain, which can improve the output linearity in a wide power range. Furthermore, the quality of digital communication can be improved by linearity feedback controller 118 or the base band processor 120 that can provide control signals to gain control circuit and gain control circuit to adjust the amplitude of the input RF signal based the known relationship between digital communication quality and output power level.

Figure 2A:
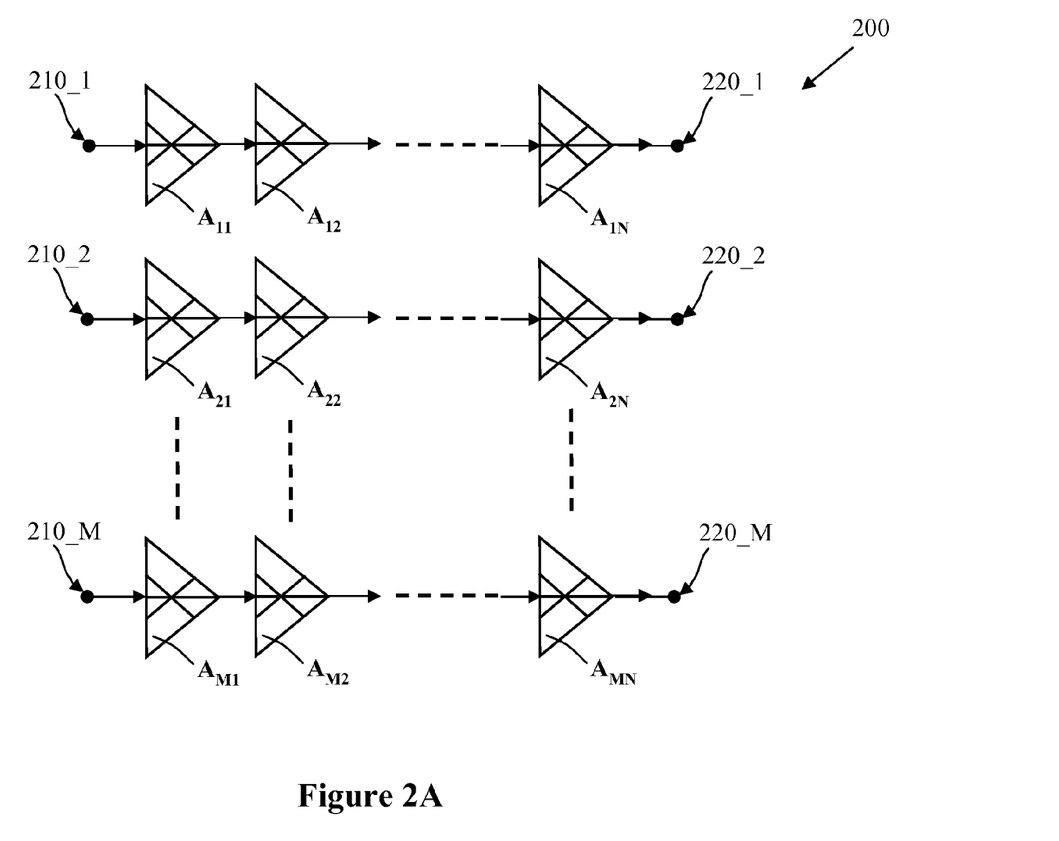
FIG. 2A is a schematic diagram for an exemplified matrix power amplifier circuit compatible with the RF amplifier circuit in FIG. 1.

In accordance to the present invention, referring to FIG. 2A, a matrix power amplifier circuit 200 compatible with the matrix power amplifier circuit 112 includes input nodes 210_1-210_M, output nodes 220_1-220_M, and a matrix of configurable amplifier elements $A_{ij}$, wherein i is equal to 1, 2 ... M, j is equal to 1, 2 ... N, and M and N are positive integers equal to or larger than 2. For a fixed i, a row of amplifier elements $A_{i1}, A_{i2}, \ldots A_{iN}$ are cascade connected. In other words, the output of the RF amplifier element $A_{ij}$ is connected to the input of the RF amplifier element $A_{i(j+1)}$. The input nodes 210_1, 210_2 ... and 210_M can receive transmission RF signals from the up converter (126 in FIG. 1). The first amplifier elements $A_{i1}$ in different rows (i.e. the input of each row) are respectively connected to the input nodes 210_1, 210_2 ... and 210_M. The outputs of the RF amplifier elements $A_{iN}$ (the last amplifier element in different rows) are respectively connected to the output nodes 220_1, 220_2 ... and 220_M. Each row of the amplifier elements can receive a separate transmitting RF signal from the up-converter (e.g. 126 in FIG. 1) and send an output signal to be transmitted by a separate antenna (e.g. 150 in FIG. 1). The different rows of amplifier elements can thus enable multiple output (MO) wireless applications such as space-time code and spatial multiplexing.

As discussed in more detail in conjunctions with the exemplified matrix power amplifier circuits shown in FIGS. 2B and 2C below, two or more of the input nodes 210_1, 210_2 ... and 210_M can be dynamically connected to receive a common transmitting RF signal from the RF transceiver 125. Two or more of the output nodes 220_1, 220_2 ... and 220_M can be connected to output a common amplified RF signal to the matching circuit 130 and the antenna(s) 150. The connections of the input nodes 210_1, 210_2 ... and 210_M can be dynamically configured by switches under the control of the matrix power amplifier selector 114. Likewise, the connections of the output nodes 220_1, 220_2 ... and 220_M can also be dynamically configured by switches under the control of the matrix power amplifier selector 114.

Figure 3A:
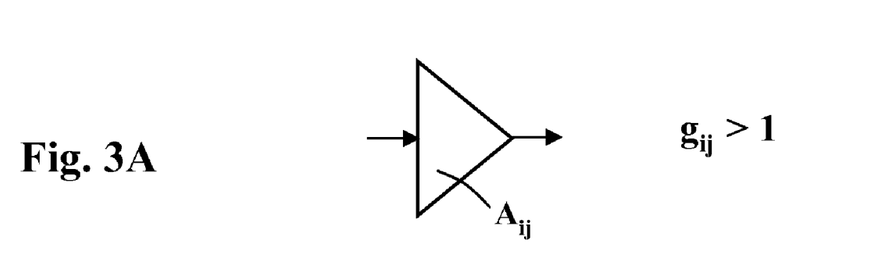
FIGS. 3A-3C illustrate the logic states of an amplifier element in the matrix power amplifier circuit of FIGS. 2 and 2A.
Figure 3B:
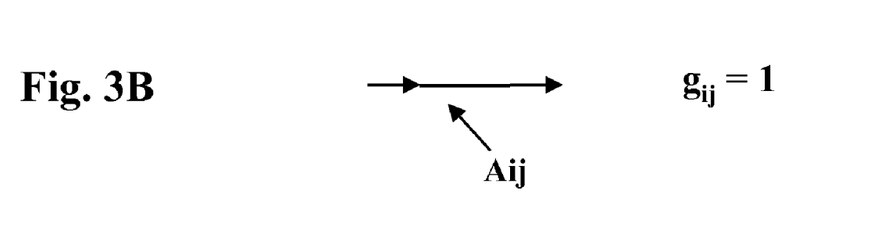
Figure 3C:
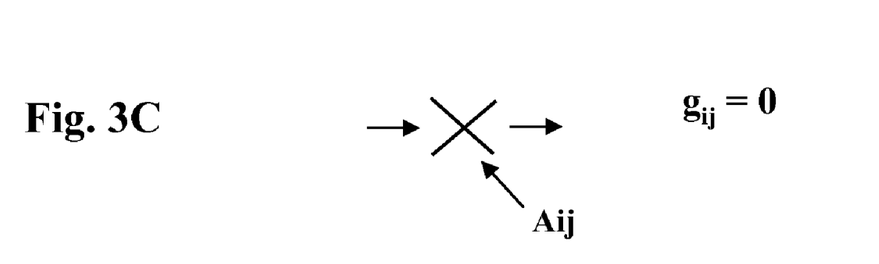

Each configurable amplifier element $A_{ij}$, referring to FIGS. 3A-3C, can be controlled to three states: in a first state (shown in FIG. 3A), an RF signal input to the amplifier elements $A_{ij}$ is amplified by a gain $g_{ij}$ larger than one, wherein the gain of an amplifier element is defined by:

$$g = P_{output}/P_{input} \quad (1)$$

wherein $P_{output}$ and $P_{input}$ are respectively output and input RF powers of a power amplifier element. The first state can also be called an active gain state.

In a second state (shown in FIG. 3B), the gain of the amplifier element $A_{ij}$ is equal to one, which means that the RF signal input to the amplifier elements $A_{ij}$ is passed to the output of the amplifier element $A_{ij}$ without amplification. The second state can also be called a pass-through state.

In a third state (shown in FIG. 3C), the gain of the amplifier element $A_{ij}$ is zero, that is, the RF signal input to the amplifier elements $A_{ij}$ is blocked from reaching the output of the amplifier element $A_{ij}$ without amplification. The third state can also be called a disconnect or blocked state.

The amplifier element can be implemented in different designs without deviation from the spirit of the present invention. For example, the second state can be implemented by a switchable conducting circuit that is parallel to an RF power amplifier. The first state is obtained when the parallel conducting path is switched to be open. The second state can be obtained (gain equal to one) is achieved when the parallel conducting path is switched to be closed to pass through the input RF signal. The third state can be implemented by a switch in serial connection to an RF power amplifier. When the serially connected switch is closed, the amplifier element is allowed to be in the first state or the second state (governed by the switchable parallel circuit). The third state can be obtained (gain equal to zero) is obtained when the serially connected switch is open.

The different cascade-connected rows of amplifier elements $A_{ij}$ can be configured to provide different magnitudes of amplifications to an input RF signal. In operation, the matrix power amplifier selector 114 can send selection signal to the Matrix power amplifier circuit 112 to activate the just sufficient number of amplifier elements $A_{ij}$ (the first state, FIG. 3A), deactivate other amplifier element $A_{ij}$ to a pass mode (the second state, FIG. 3B), and block RF signals at some other amplifier elements $A_{ij}$ (the third state, FIG. 3C) so that the power consumption is minimized while providing the required amplification.

Figure 2B:
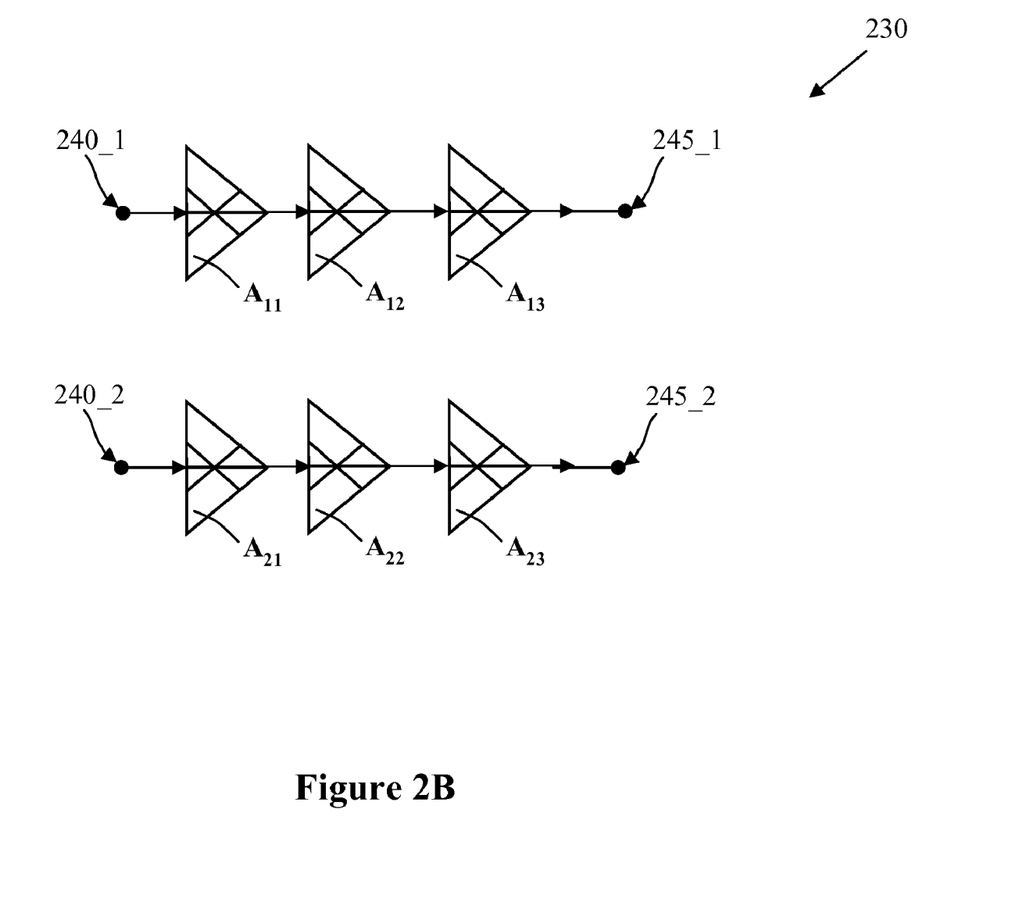
FIG. 2B is a schematic diagram for an example of the matrix power amplifier circuit in FIG. 2A.

FIG. 2B shows an example of the matrix power amplifier circuit 200. The matrix power amplifier circuit 230 includes a row of configurable amplifier elements $A_{11}, A_{12}, A_{13}$ cascade connected between an input node 240_1 and an output node 245_1, which can amplify a transmission RF signal received from the up converter (e.g. 126 in FIG. 1) and output the amplified RF signal to an antenna (e.g. 150 in FIG. 1). A second row of configurable amplifier elements $A_{21}, A_{22}, A_{23}$ are cascade-connected between an input node 240_2 and an output node 245_2. Assuming the amplifier elements $A_{11}, A_{12}, A_{13}, A_{21}, A_{22}, A_{23}$ each has a gain approximately equal to 10, the gain of each row of amplifier elements is $$g = 10 \times 10 \times 10 = 1000. \quad (2)$$

The dB Gain G of each row of the amplifier elements is:

$$G = 10 \log_{10}(1000) \text{ dB} = 30 \text{ dB}. \quad (3)$$

Figure 2C:
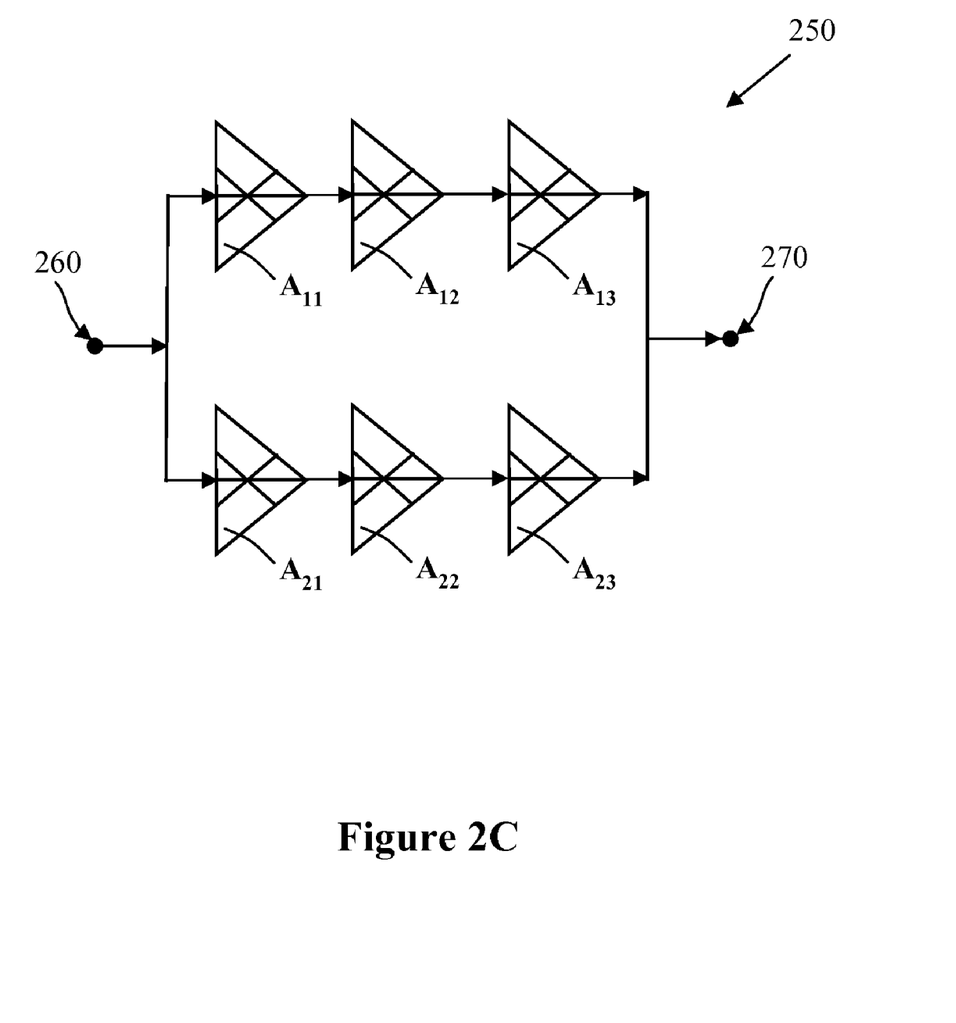
FIG. 2C is a schematic diagram for another example of the matrix power amplifier circuit in FIG. 2A.

FIG. 2C shows another example of the matrix power amplifier circuit 200. The matrix power amplifier circuit 250 includes a row of cascade connected amplifier elements $A_{11}$, $A_{12}$, $A_{13}$ and a row of cascade-connected amplifier elements $A_{21}$, $A_{22}$, $A_{23}$. The two rows are connected in parallel and have an input node 260. The outputs of the two rows of amplifier elements are also connected an output node 270. The connection of the input nodes for the different rows of amplifier elements can be controlled by the matrix power amplifier selector 114 (FIG. 1). Likewise, the connection of the output nodes for the different rows of amplifier elements can also be controlled by the matrix power amplifier selector 114 (FIG. 1). Assuming the amplifier elements $A_{11}$, $A_{12}$, $A_{13}$, $A_{21}$, $A_{22}$, $A_{23}$ each has a gain approximately equal to 10, the overall output of the matrix power amplifier circuit 250 can be flexibly configured to achieve power efficiency.

For example, consider the case that at least one of the amplifier elements $A_{11}$, $A_{12}$, $A_{13}$ in the first row is in the zero gain (or the disconnect) state (FIG. 3C) while the amplifier elements $A_{21}$, $A_{22}$, $A_{23}$ are in either the active gain state or the pass-through state (FIGS. 3A and 3B). The overall Gain in dB, $G_{overall}$, of the matrix power amplifier circuit 250 is expressed by the follow equation:

$$G_{overall} = 10 \log_{10}(g_{21} \times g_{22} \times g_{23}) \text{ dB}, \quad (4)$$

wherein $g_{21}$, $g_{22}$, $g_{23}$ are respectively the gains of the amplifier elements $A_{21}$, $A_{22}$, $A_{23}$. When all the amplifier elements in the second row are in the pass-through state, the amplifier elements $A_{21}$, $A_{22}$, $A_{23}$ have gains $g_{2j}$'s equal to 1. The overall gain is also 1 and the dB Gain is 0 dB. When the number of amplifier elements in the active gain state is 1 in the second row, one of the amplifier elements $A_{21}$, $A_{22}$, $A_{23}$ has a gain equal to 10 and the other two are in pass-through states and have gains equal to 1, the overall dB Gain is $$G_{overall} = 10 \log_{10}(10 \times 1 \times 1) \text{ dB} = 10 \text{ dB}. \quad (5)$$

Similarly, when the number of amplifier elements in the active gain state is 2 in the first row, the remaining amplifier element is in the pass-through state. The overall dB Gain is:

$$G_{overall} = 10 \log_{10}(10 \times 10 \times 1) \text{ dB} = 20 \text{ dB}. \quad (6)$$

When all 3 amplifier elements are in the active gain state in the first row, the overall dB Gain is $$G_{overall} = 10 \log_{10}(10 \times 10 \times 10) \text{ dB} = 30 \text{ dB}. \quad (7)$$

When the amplifier elements in the two rows of are configured at the same states, the overall gains of the matrix power amplifier circuit 250 remain the same, but the output RF power can be doubled. For example, if each row has a single amplifier element in an active gain state and two in the pass-through state, the overall dB gain $G_{overall}$ is still 10 dB. However, since the same input RF signal is amplified by two sets (rows) of amplifier elements, the output RF power is twice as large as the case when a single row of amplifier elements are activated.

An advantage of the presently disclosed matrix power amplifier circuit is that sufficient output RF power can be provided if high power RF output is needed to extend RF communication range, whereas amplifiers' power consumption can be reduced when moderate output RF power is sufficient (e.g. for short range RF communications). Referring to FIG. 2A, the number of amplifier elements involved in RF amplification can be flexibly configured by connecting the input RF signal to different numbers of input nodes 210_1, 210_2 . . . 210_M as well as transmitting amplified output RF signals from the corresponding output nodes 220_1, 220_2 . . . 220_M. Moreover, the number of amplifier elements that are in active gain states can be dynamically configured. In summary, the number of active-gain amplifier elements can be varied from 1 (or 0) to M times N in the matrix power amplifier circuit 200.

Figure 4:
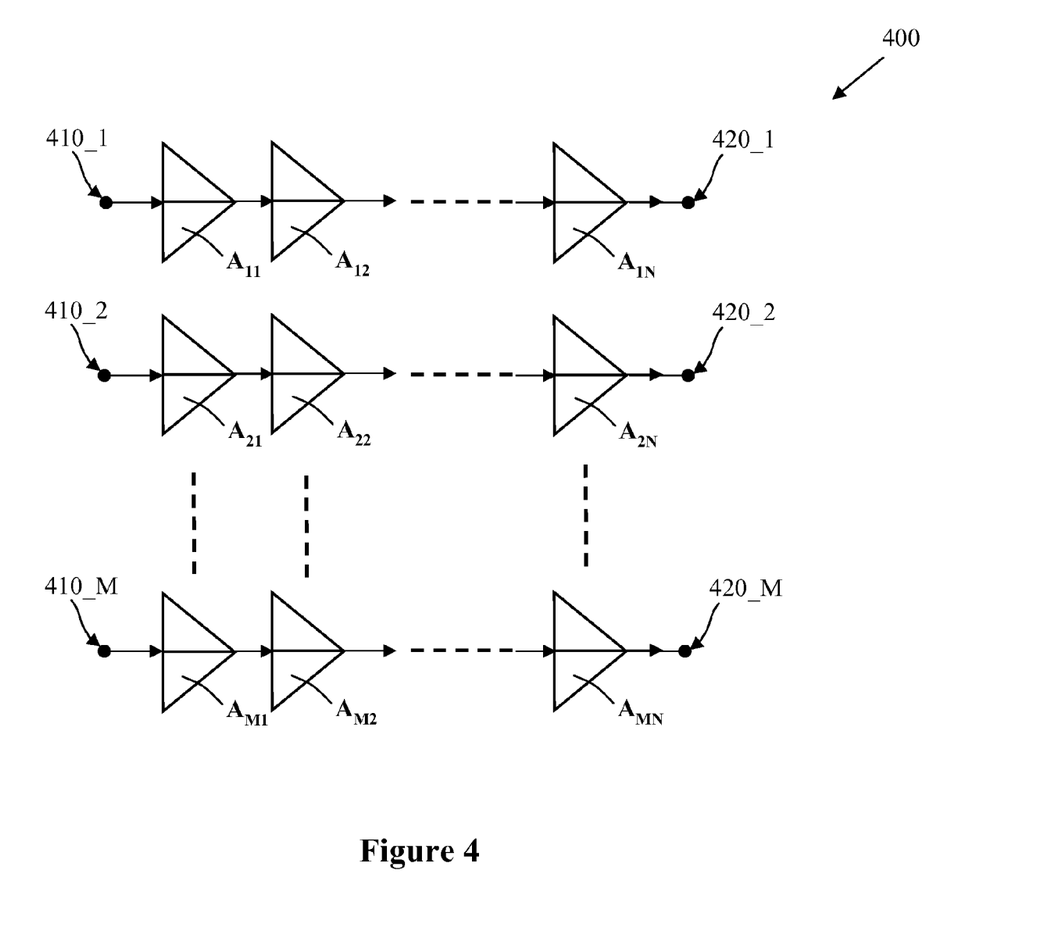
FIG. 4 is a schematic diagram for another exemplified matrix power amplifier circuit compatible with the RF amplifier circuit in FIG. 1.

In some embodiments, referring to FIG. 4, a matrix power amplifier circuit 400 compatible with the Matrix power amplifier circuit 112 includes input nodes 410_1-410_M, output nodes 420_1-420_M, and a matrix of configurable amplifier elements $A_{ij}$, wherein i is equal to 1, 2 . . . N, j is equal to 1, 2 . . . M, and M and N are positive integers equal to or larger than 2. For a fixed i, $A_{i1}$, $A_{i2}$, . . . $A_{iN}$ are cascade connected. In other words, the output of the RF amplifier element $A_{ij}$ is connected to the input of the RF amplifier element $A_{i(j+1)}$. The inputs of the RF amplifier elements $A_{i1}$ (the first amplifier element in different rows) are respectively connected to the input nodes 410_1, 410_2 . . . and 410_M. The outputs of the RF amplifier elements $A_{iN}$ (the last amplifier element in different rows) are respectively connected to the output nodes 420_1, 420_2 . . . and 420_M. Each row of the amplifier elements can receive a separate transmitting RF signal from the up-converter (e.g. 126 in FIG. 1) and send an output signal to be transmitted by a separate antenna (e.g. 150 in FIG. 1). The different rows of amplifier elements can thus enable multiple output (MO) WiMax applications such as space-time code and spatial multiplexing. In some embodiments, the input nodes 410_1, 410_2 . . . and 410_M can be connected to receive common transmitting RF signals from the up converter, similar to the arrangement shown in FIG. 2C.

Figure 5A:
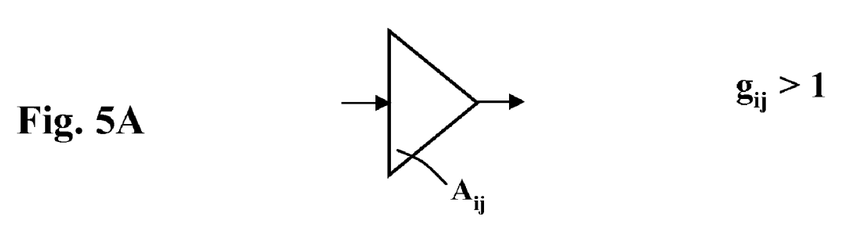
FIGS. 5A and 5B illustrate the logic states of an amplifier element in the matrix power amplifier circuit of FIG. 4.
Figure 5B:
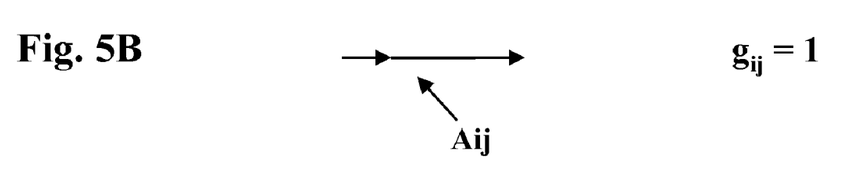

Each amplifier element $A_{ij}$, referring to FIGS. 5A and 5B, can be controlled to two states: in a first state (shown in FIG. 5A), an RF signal input to the amplifier elements $A_{ij}$ is amplified by a gain $g_{ij}$ larger than one. In a second state (shown in FIG. 5B), the gain of the amplifier element $A_{ij}$ is one, which means that the RF signal input to the amplifier elements $A_{ij}$ is passed to the output of the amplifier elements $A_{ij}$ without amplification. The operations of matrix power amplifier circuit 400 are similar to those of the matrix power amplifier circuit 200 as described above except for that a third state of zero gain is not provided. Thus the combined amplification of each row of amplifier elements can be reduced or varied by setting the gain of one or more of the amplifier elements in that row to be equal to one (i.e. at the second state, shown in FIG. 5B). All rows of amplifier elements in the matrix power amplifier circuit 400 are activated (i.e. without blocking of RF signals) in operation.

Figure 6:
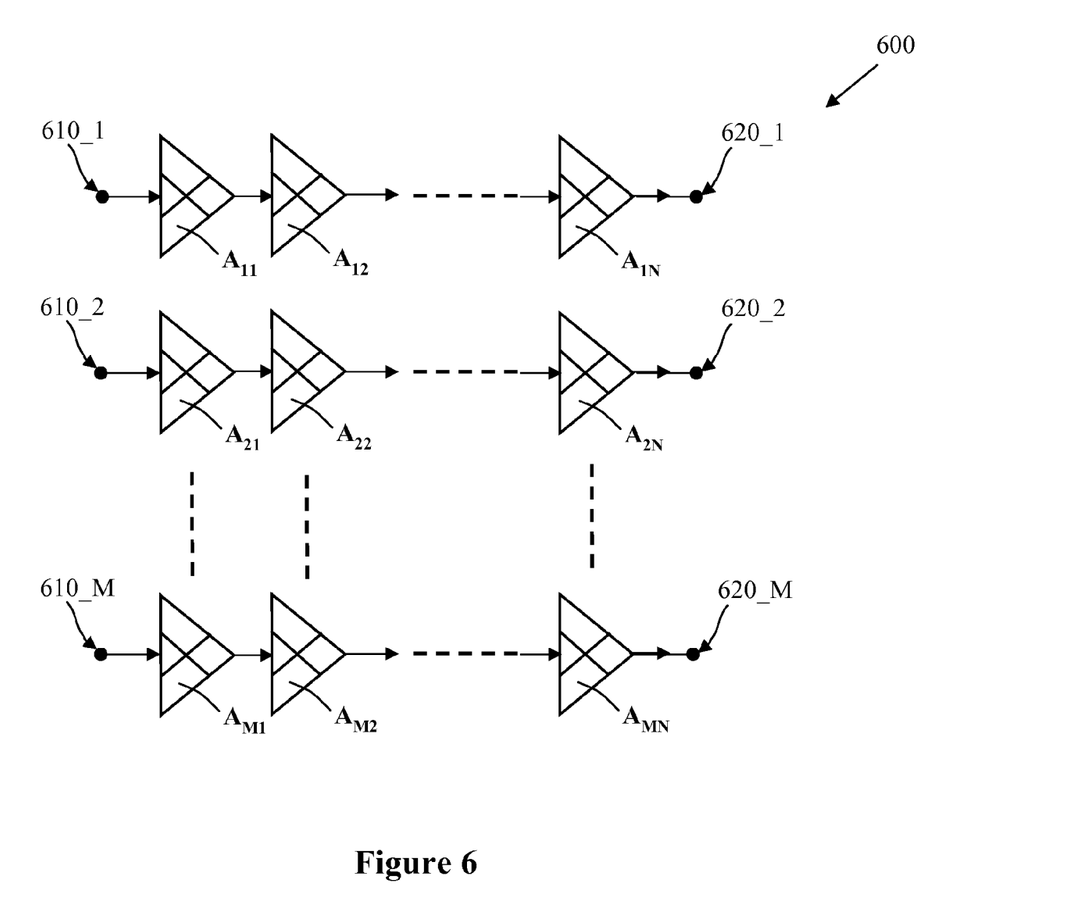
FIG. 6 is a schematic diagram for another exemplified matrix power amplifier circuit compatible with the RF amplifier circuit in FIG. 1.

In some embodiments, referring to FIG. 6, a matrix power amplifier circuit 600 compatible with the Matrix power amplifier circuit 112 includes input nodes 610_1-610_M, output nodes 620_1-620_M, and a matrix of configurable amplifier elements $A_{ij}$, wherein i is equal to 1, 2 . . . N, j is equal to 1, 2 . . . M, and M and N are positive integers equal to or larger than 2. For a fixed i, $A_{i1}$, $A_{i2}$, . . . $A_{iN}$ are cascade connected. In other words, the output of the RF amplifier element $A_{ij}$ is connected to the input of the RF amplifier element $A_{i(j+1)}$. The inputs of the RF amplifier elements $A_{i1}$ (the first amplifier element in different rows) are respectively connected to the input nodes 610_1, 610_2 . . . and 610_M. The outputs of the RF amplifier elements $A_{iN}$ (the last amplifier element in different rows) are respectively connected to the output nodes 620_1, 620_2 . . . and 620_M. Each row of the amplifier elements can receive a separate transmitting RF signal from the up-converter (e.g. 126 in FIG. 1) and send an output signal to be transmitted by a separate antenna (e.g. 150 in FIG. 1). The different rows of amplifier elements can thus enable multiple output (MO) WiMax applications such as space-time code and spatial multiplexing. In some embodiments, the input nodes 610_1, 610_2 ... and 610_M can be connected to receive common transmitting RF signals from the up converter, similar to the arrangement shown in FIG. 2C.

Figure 7A:
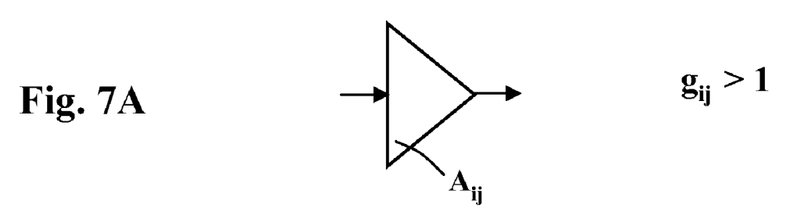
FIGS. 7A and 7B illustrate the logic states of an amplifier element in the matrix power amplifier circuit of FIG. 6.
Figure 7B:
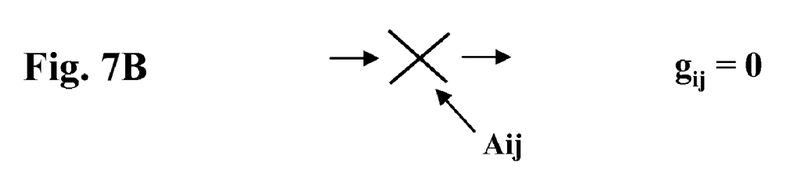

Each amplifier element $A_{ij}$, referring to FIGS. 7A and 7B, can be controlled to two states: in a first state (shown in FIG. 7A), an RF signal input to the amplifier elements $A_{ij}$ is amplified by a gain $g_{ij}$ larger than one. In a second state (shown in FIG. 7B), the gain of the amplifier element $A_{ij}$ is zero, that is, the RF signal input to the amplifier elements $A_{ij}$ is blocked from reaching the output of the amplifier elements $A_{ij}$. The operations of matrix power amplifier circuit 600 are similar to those of the matrix power amplifier circuit 200 as described above except for that a third state of gain equal to one is not provided. Thus the combined amplification of each row of amplifier elements is fixed when all the amplifier elements are activated (i.e. at the first state, shown in FIG. 7A). Different rows of amplifier elements in the matrix power amplifier circuit 600 can be selectively turned on or off by blocking RF signals at in at least one amplifier element (the second state, FIG. 7) in some rows of amplifier elements.

Figure 8:
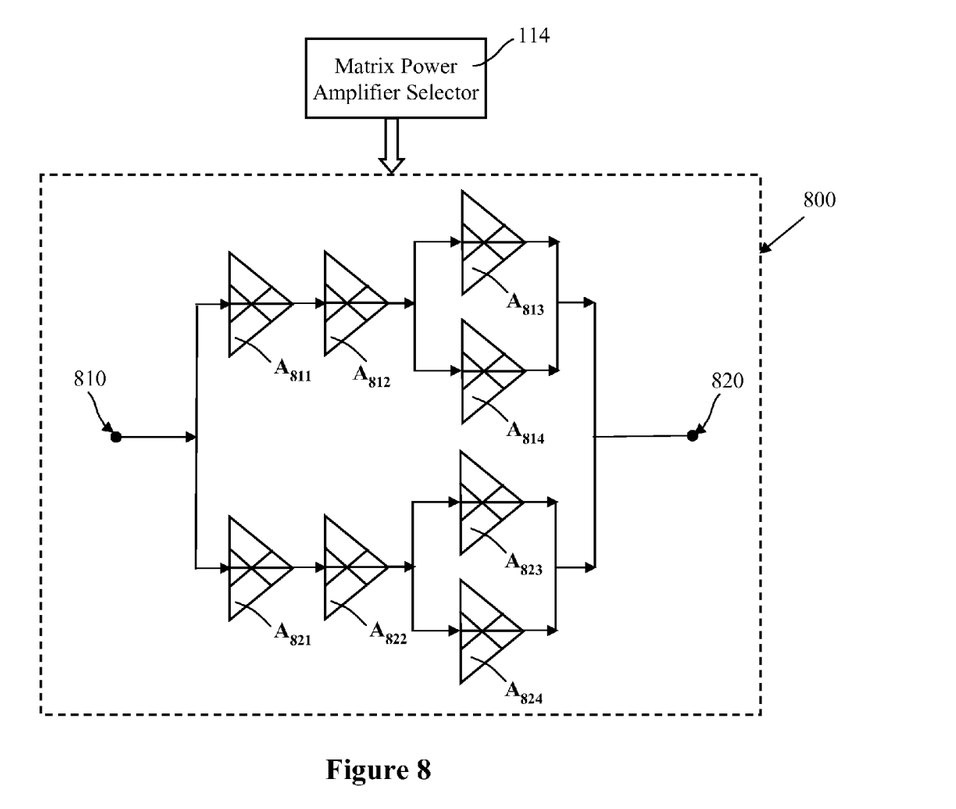
FIG. 8 is a schematic diagram for another exemplified matrix power amplifier circuit compatible with the RF amplifier circuit in FIG. 1.

In some embodiments, referring to FIG. 8, a matrix power amplifier circuit 800 compatible with the Matrix power amplifier circuit 112 includes a single input node 810, a single output node 820, and a matrix of amplifier elements $A_{811}$-$A_{814}$ and $A_{821}$-$A_{824}$. The overall layout of the matrix power amplifier circuit 800 is somewhat similar to the matrix power amplifier circuit 250 in FIG. 2B. In the first row, the amplifier elements $A_{811}$ and $A_{812}$ are cascade connected. The amplifier elements $A_{813}$ and $A_{814}$ are connected in parallel, which together is cascade connected to the output of $A_{812}$. The amplifier elements $A_{813}$ and $A_{814}$ can be referred to "a recursive cell" in the overall cascade connection in the first row. The amplifier elements $A_{821}$-$A_{824}$ in the second row are connected in a similar pattern as in the first row. Each of the amplifier elements $A_{811}$-$A_{814}$ and $A_{821}$-$A_{824}$ in the matrix power amplifier circuit 800 can be separated controlled to an "on" or an "off" state by the matrix power amplifier selector 114. The additional "recursive cells" in the two rows of amplifier elements $A_{811}$-$A_{814}$ and $A_{821}$-$A_{824}$ provides additional power control and more selection of amplification ranges. By turning one or both of the amplifier elements $A_{813}$ and $A_{814}$ on, the recursive cell can provide twice as much output RF power than a single amplifier element. It should be understood that the amplifier elements can have gains g other than 10; other dB Gain values can also be obtained by the presently disclosed matrix amplifier circuit.

It is understood that the matrix power amplifier circuit can include a combination of the different types of amplifier elements as shown in FIGS. 2A-3C, FIGS. 4-5B, FIGS. 6-7B, and FIG. 8, which can allow different amplifier elements in the matrix to be flexibly turned on and off to control gain magnitude (or gain dynamic range) in each row as well as the number of activated rows of amplifier elements in the matrix. The described flexibility can allow minimum and customized activated amplifier elements for each mode of power amplification.

The disclosed matrix RF power amplifier circuits can be compatible with other variations without deviating from the spirit of the present application. The gain and phase response curves and the output power ranges shown in disclosed figures are meant to be illustration purposes. The disclosed systems and methods are suitable to other gain and phase response characteristics in different power ranges.

The disclosed RF amplifier circuits are suitable for different wireless modulation schemes such as OFDM and OFDMA, and various wireless communications standards and protocols, including Global System for Mobile communications (GSM), Universal Mobile Telecommunications Service (UMTS), Code Division Multiple Access (CDMA). GSM can include GPRS, EDGE and CSD. UMTS can include Wideband Code Division Multiple Access (WCDMA), High-Speed Packet Access (HSPA), High-Speed Downlink Packet Access (HSDPA), TD-SCDMA, Long Term Evolution (LTE), and LTE-Advanced. CDMA can include CDMA2000 and Ultra Mobile Broadband (UMB). Suitable wireless communications standards also include 3GPP, LTE, LTE-Advanced, IMT-2000, WiMax (802.16), WiBro, or WiFi (802.11), and others.

What is claimed is:

1. A wireless communication device, comprising:
   a radio frequency (RF) transceiver configured to up convert one or more base band signals to one or more transmitting RF signals;
   an RF amplifier circuit configured to amplify the one or more transmitting RF signals to produce one or more amplified RF signals, wherein the RF amplifier circuit includes:
      a matrix of configurable RF amplifier elements $A_{ij}$ connected in M rows, wherein M is an integer of at least 2, wherein i=1, 2 ... M and j=1, 2 ... N, wherein N is an integer, wherein the output of the RF amplifier element $A_{ij}$ is connected to the input of the RF amplifier element $A_{i(j+1)}$, wherein the RF amplifier element $A_{ij}$ is configured to be controlled to at least three states, wherein the RF amplifier element $A_{ij}$ is configured to amplify an RF signal by a gain $g_{ij}>1$ in a first state, wherein $g_{ij}$ is the ratio of the output RF power over the input RF power for the RF amplifier element $A_i$, wherein the RF amplifier element $A_{ij}$ is configured to pass the RF signal without amplification to the input of the RF amplifier element $A_{i(j+1)}$ in a second state, wherein the RF amplifier element $A_{ij}$ is configured to substantially block the RF signal from reaching the input of the RF amplifier element $A_{i(j+1)}$ in a third state;
      a plurality of input nodes each in communication with the RF transceiver and connected to the input of one of the RF amplifier elements $A_{i1}$; and
      a plurality of output nodes each configured to output the amplified RF signal from one of the RF amplifier elements $A_{iN}$; and
   one or more antennas each configured to transmit a wireless signal in response to the amplified RF signal from one or more of the plurality of the output nodes.

2. The wireless communication device of claim 1, further comprising a matrix power amplifier selector configured to control the RF amplifier element $A_{ij}$ to be in one of the three states.

3. The wireless communication device of claim 2, further comprising a sensing circuit configured to sense at least one of a power, a gain, or a phase of the amplified RF signal and to produce a sensing signal, wherein the matrix power amplifier selector is configured to control the RF amplifier element $A_{ij}$ in response to the sensing signal.

4. The wireless communication device of claim 2, further comprising a linearity feedback controller configured to control gain or phase variation in a power amplification range of the amplified RF signal in response to the sensing signal.

5. The wireless communication device of claim 2, wherein the matrix power amplifier selector is configured to vary the combined amplification of a row of RF amplifier elements $A_{ij}$ in the matrix by controlling at least one of the RF amplifier elements $A_{ij}$ in the row to the second state.

6. The wireless communication device of claim 2, wherein the matrix power amplifier selector is configured to deactivate at least one row of RF amplifier elements $A_{ij}$ in the matrix by controlling at least one of the RF amplifier elements $A_{ij}$ in the row to the third state.

7. The wireless communication device of claim 1, wherein two or more of the plurality of input nodes are connected to receive a common transmitting RF signal from the RF transceiver.

8. The wireless communication device of claim 1, wherein two or more of the plurality of output nodes are connected to output a common amplified RF signal.

9. The wireless communication device of claim 1, wherein the RF transceiver and the RF amplifier circuit are compatible with wireless modulation schemes Orthogonal Frequency-Division Multiplexing (OFDM) or Orthogonal Frequency-Division Multiplexing Access (OFDMA).

10. The wireless communication device of claim 1, wherein the RF transceiver and the RF amplifier circuit are compatible with wireless communications standards 3GPP, LTE, LTE-Advanced, IMT-2000, WiMax (802.16), WiBro, or WiFi (802.11).

11. A wireless communication device, comprising:
a radio frequency (RF) transceiver configured to up convert one or more base band signals to one or more transmitting RF signals;
an RF amplifier circuit configured to amplify the one or more transmitting RF signals to produce one or more amplified RF signals, wherein the RF amplifier circuit includes:
a matrix of configurable RF amplifier elements $A_{ij}$ connected in M rows, wherein M is an integer of at least 2, wherein i=1, 2 . . . M and j=1, 2 . . . N, wherein N is an integer, wherein the output of the RF amplifier element $A_{ij}$ is connected to the input of the RF amplifier element $A_{i(j+1)}$, wherein the RF amplifier element $A_{ij}$ is configured to be controlled to two or more states, wherein the RF amplifier element $A_{ij}$ is configured to amplify an RF signal by a gain $g_{ij}>1$ in a first state, wherein $g_{ij}$ is the ratio of the output RF power over the input RF power for the RF amplifier element $A_{ij}$, wherein the RF amplifier element $A_{ij}$ is configured to pass the RF signal without amplification to the input of the RF amplifier element $A_{i(j+1)}$ in a second state;
a plurality of input nodes each in communication with the RF transceiver and connected to the input of one of the RF amplifier elements $A_{i1}$; and
a plurality of output nodes each configured to output the amplified RF signal from one of the RF amplifier elements $A_{iN}$; and
one or more antennas each configured to transmit a wireless signal in response to the amplified RF signal from one or more of the plurality of the output nodes.

12. The wireless communication device of claim 11, further comprising a matrix power amplifier selector configured to control the RF amplifier element $A_{ij}$ to be in one of the two or more states.

13. The wireless communication device of claim 12, further comprising a sensing circuit configured to sense at least one of a power, a gain, or a phase of the amplified RF signal and to produce a sensing signal, wherein the matrix power amplifier selector is configured to control the RF amplifier element $A_{ij}$ in response to the sensing signal.

14. The wireless communication device of claim 11, wherein two or more of the plurality of output nodes are connected to output a common amplified RF signal.

15. The wireless communication device of claim 11, wherein two or more of the plurality of input nodes are connected to receive common one or more transmitting RF signals from the RF transceiver.

16. A wireless communication device, comprising:
a radio frequency (RF) transceiver configured to up convert one or more base band signals to one or more transmitting RF signals;
an RF amplifier circuit configured to amplify the one or more transmitting RF signals to produce one or more amplified RF signals, wherein the RF amplifier circuit includes:
a matrix of configurable RF amplifier elements $A_{ij}$ connected in M rows, wherein M is an integer of at least 2, wherein i=1, 2 . . . M and j=1, 2 . . . N, wherein N is an integer, wherein the output of the RF amplifier element $A_{ij}$ is connected to the input of the RF amplifier element $A_{i(j+1)}$, wherein the RF amplifier element $A_{ij}$ is configured to be controlled to two or more states, wherein the RF amplifier element $A_{ij}$ is configured to amplify an RF signal by a gain $g_{ij}>1$ in a first state, wherein $g_{ij}$ is the ratio of the output RF power over the input RF power for the RF amplifier element $A_{ij}$, wherein the RF amplifier element $A_{ij}$ is configured to substantially block the RF signal from reaching the input of the RF amplifier element $A_{i(j+1)}$ in a second state;
a plurality of input nodes each in communication with the RF transceiver and connected to the input of one of the RF amplifier elements $A_{i1}$; and
a plurality of output nodes each configured to output the amplified RF signal from one of the RF amplifier elements $A_{iN}$; and
one or more antennas each configured to transmit a wireless signal in response to the amplified RF signal from one or more of the plurality of the output nodes.

17. The wireless communication device of claim 16, further comprising a matrix power amplifier selector configured to control the RF amplifier element $A_{ij}$ to be in one of the two or more states.

18. The wireless communication device of claim 16, further comprising a sensing circuit configured to sense at least one of a power, a gain, or a phase of the amplified RF signal and to produce a sensing signal, wherein the matrix power amplifier selector is configured to control the RF amplifier element $A_{ij}$ in response to the sensing signal.

19. The wireless communication device of claim 16, wherein two or more of the plurality of output nodes are connected to output a common amplified RF signal.

20. The wireless communication device of claim 16, wherein two or more of the plurality of input nodes are connected to receive common one or more transmitting RF signals from the RF transceiver.

21. A wireless communication device, comprising:
a radio frequency (RF) transceiver configured to up convert one or more base band signals to one or more transmitting RF signals;

a multiple-inputs-multiple-outputs (MIMO) RF amplifier circuit configured to amplify the one or more transmitting RF signals in to produce one or more amplified RF signals in, wherein the RF amplifier circuit includes:
   a plurality of configurable RF amplifier elements $A_{ij}$ disposed in a plurality of parallel rows, wherein at least one of the plurality of rows comprises a first RF amplifier element and a second RF amplifier element that are connected in a parallel circuit and a third RF amplifier element that is cascade connected to the parallel circuit of the first RF amplifier element and the second RF amplifier element together, wherein each of the RF amplifier elements is configured to be controlled to at least three states, wherein each of the RF amplifier elements is configured to amplify an RF signal by a gain $g_{ij}>1$ in a first state, to pass the RF signal without amplification in a second state, and to substantially block the RF signal in a third state, wherein $g_{ij}$ is the ratio of the output RF power over the input RF power for the RF amplifier element $A_j$;
   a plurality of input nodes each in communication with the RF transceiver and connected to the input of one of the RF amplifier elements $A_{i1}$; and
   a plurality of output nodes each configured to output the amplified RF signal from one of the RF amplifier elements $A_{iN}$; and
   one or more antennas each configured to transmit a wireless signal in response to the amplified RF signal from one or more of the plurality of the output nodes.

22. The wireless communication device of claim 21, further comprising a matrix power amplifier selector configured to control the RF amplifier element $A_{ij}$ to be in one of the two or more states.

23. The wireless communication device of claim 21, wherein two or more of the plurality of output nodes are connected to output a common amplified RF signal, and wherein two or more of the plurality of input nodes are connected to receive common one or more transmitting RF signals from the RF transceiver.

* * * * *